United States Patent
Su et al.

(10) Patent No.: US 7,053,414 B2
(45) Date of Patent: May 30, 2006

(54) OPTICAL SEMICONDUCTOR COMPONENT TO PREVENT ELECTRIC LEAKAGE AND PROVIDE DIFFERENT DRIVING VOLTAGES

(75) Inventors: Hung-Yuan Su, Taipei (TW); Jen Chun Weng, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 89 days.

(21) Appl. No.: 10/821,967

(22) Filed: Apr. 12, 2004

(65) Prior Publication Data
US 2005/0224815 A1    Oct. 13, 2005

(51) Int. Cl.
*H01L 27/15* (2006.01)
*H01L 29/267* (2006.01)
*H01L 31/12* (2006.01)
*H01L 33/00* (2006.01)

(52) U.S. Cl. .......................... 257/81; 257/88; 257/95; 257/98; 257/99; 257/100; 257/684; 257/685; 257/687; 257/692; 257/723; 257/730; 257/735; 257/784; 257/787

(58) Field of Classification Search ................ 257/684, 257/687, 723, 730, 787, 81, 88, 95, 98–100, 257/692, 784, 735, 685
See application file for complete search history.

(56) References Cited

U.S. PATENT DOCUMENTS

| | | | | |
|---|---|---|---|---|
| 3,764,862 A | * | 10/1973 | Jankowski | 257/98 |
| 4,114,177 A | * | 9/1978 | King | 257/81 |
| 4,209,358 A | * | 6/1980 | DiLeo et al. | 156/293 |
| 5,049,977 A | * | 9/1991 | Sako | 257/676 |
| 5,064,968 A | * | 11/1991 | Kovacs et al. | 174/52.4 |
| 5,083,189 A | * | 1/1992 | Sawaya | 257/791 |
| 5,148,243 A | * | 9/1992 | Merrick et al. | 257/81 |
| 5,198,684 A | * | 3/1993 | Sudo | 257/79 |
| 5,218,233 A | * | 6/1993 | Takahashi | 257/787 |
| 6,239,367 B1 | * | 5/2001 | Hsuan et al. | 174/52.4 |
| 6,246,123 B1 | * | 6/2001 | Landers et al. | 257/787 |
| 6,417,017 B1 | * | 7/2002 | Ih | 438/22 |
| 6,614,103 B1 | * | 9/2003 | Durocher et al. | 257/678 |
| 6,897,486 B1 | * | 5/2005 | Loh | 257/81 |
| 2004/0238836 A1 | * | 12/2004 | Lin et al. | 257/99 |

FOREIGN PATENT DOCUMENTS

TW    315528 A    9/1997

\* cited by examiner

*Primary Examiner*—Ida M. Soward
(74) *Attorney, Agent, or Firm*—Birch Stewart Kolasch & Birch LLP

(57) ABSTRACT

An optical semiconductor component has multiple conducting wire holders, multiple chip carriers secured, multiple semiconductor chips, a first curved surface made of the conducting wire holders, the semiconductor chips being placed at its focus, multiple connecting components made of the conducting wire holders, and a second curved surface surrounded by a package body, the semiconductor chips being placed at its focus. The chip carriers are independent components and have a multi-layer structure. The middle layer is an insulator used to separate the chip from the conducting wire holder electrically or thermally. Hence, when connected with a metal radiator, the chip carrier does not cause electric leakage. Further, the connecting components of the present invention are mutually independent, which can provide multiple photodiodes with different driving voltages to connect with each other in series or parallel.

18 Claims, 2 Drawing Sheets

OPTICAL SEMICONDUCTOR COMPONENT TO PREVENT ELECTRIC LEAKAGE AND PROVIDE DIFFERENT DRIVING VOLTAGES

FIELD OF THE INVENTION

The present invention is directed to an optical semiconductor component, and more particularly, to an optical semiconductor component applied in light emitting diodes (LEDs).

BACKGROUND OF THE INVENTION

Light emitting diodes (LEDs) are the most popular optical semiconductor components at present. They can be applied to electric appliances, medical instruments, traffic lights and other equipments capable of emitting light. Currently, many companies are working hard to improve the inner components of the LEDs to make the LEDs function better with improved light-emitting effects.

The "optical semiconductor assembly", disclosed in Taiwan Patent No. 315528, is a radial transmitting or receiving semiconductor assembly. In the optical semiconductor assembly, a semiconductor chip capable of radiating or receiving light is secured on a chip carrier comprising a conducting wire holder. A surface of a trough of the optical semiconductor assembly is a reflector used to radiate or receive light. The chip carrier is an electric and thermal component. Further, the semiconductor and at least a portion of the chip carrier are surrounded by a package body.

Reference is made to FIG. 1, which is a schematic diagram of the conventional optical semiconductor assembly disclosed in the patent mentioned above. It includes a semiconductor chip 1, a trough 4, multiple first connecting regions 11 and multiple second connecting regions 12.

The patent mentioned above has following drawbacks:
1. The chip carrier comprising the conducting wire holder is a common path for electricity and heat. When the chip carrier is connected to a metal radiator, it may cause electricity leakage.
2. The connecting component is a single component plus the chip carrier. It can only provide the photodiodes with same driving voltage to connect with each other in parallel.

Accordingly, as discussed above, the prior art still has some drawbacks that could be improved. The present invention aims to resolve the drawbacks in the prior art.

SUMMARY OF THE INVENTION

An objective of the present invention is to provide an optical semiconductor component, including a plurality of conducting wire holders, a plurality of independent chip carriers secured on the conducting wire holders, a plurality of semiconductor chips secured on the independent chip carriers;, and a first curved surface made of a portion of the conducting wire holders, the semiconductor chips being placed at a focus of the first curved surface, a plurality of independent connecting components made of another portion of the conducting wire holders, and a second curved surface surrounded by a package body, the semiconductor chips being placed at a focus of the second curved surface.

The chip carriers of the present invention are independent components and have a multi-layer structure. The middle layer of the chip carrier is an insulator used to separate the chip from the conducting wire holder electrically or thermally. Hence, when connected with a metal radiator, the chip carrier does not cause electric leakage. Further, the connecting components of the present invention are mutually independent, which can provide multiple photodiodes with different driving voltages to connect with each other in series or parallel.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION

Figure 1:
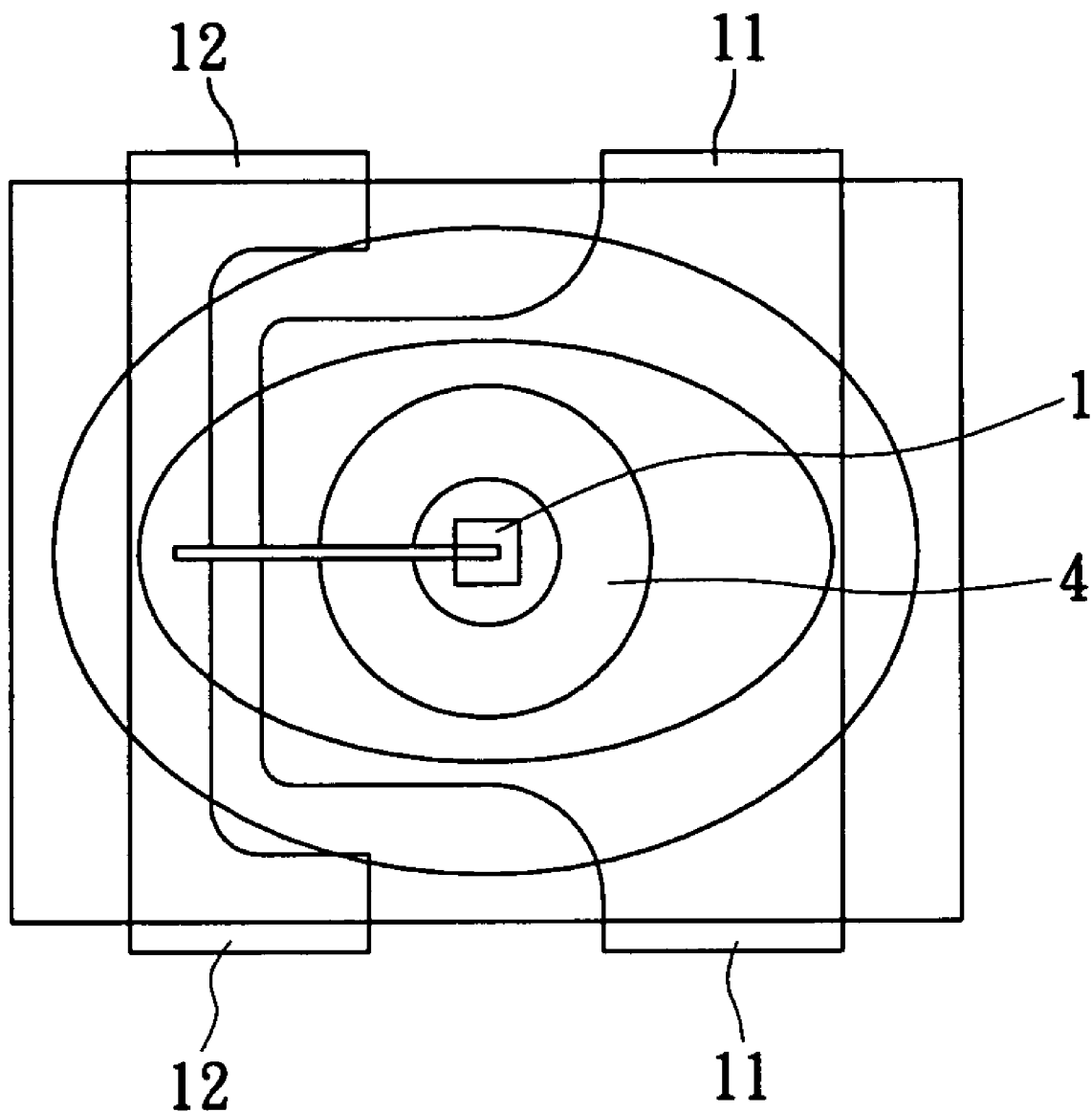
FIG. 1 is a schematic diagram of a conventional optical semiconductor assembly.
Figure 2:
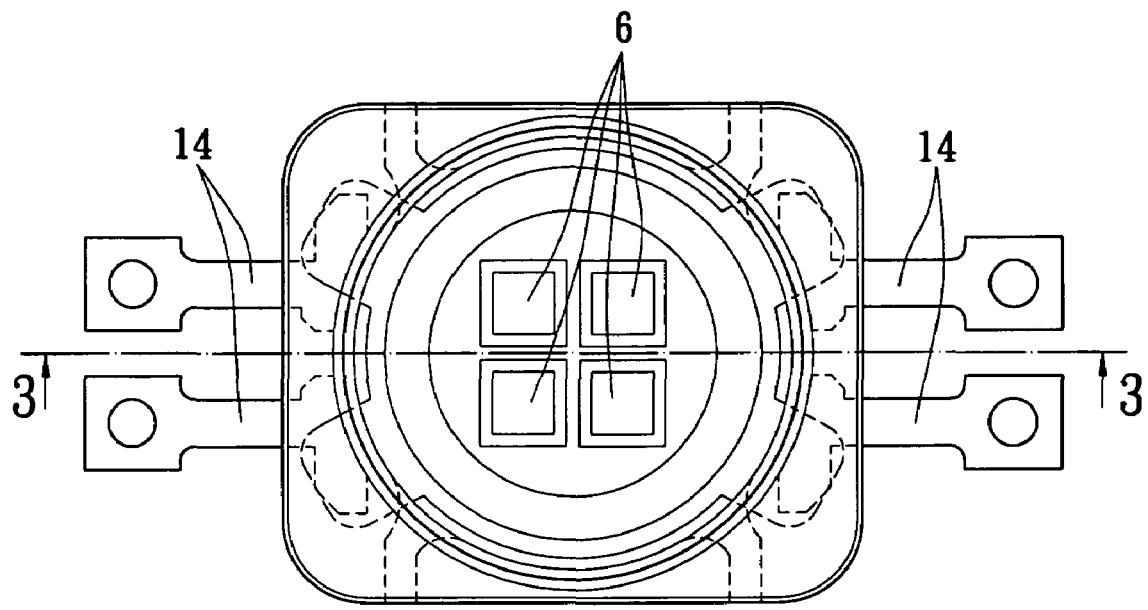
FIG. 2 is a schematic diagram of an optical semiconductor component in accordance with the present invention.
Figure 3:
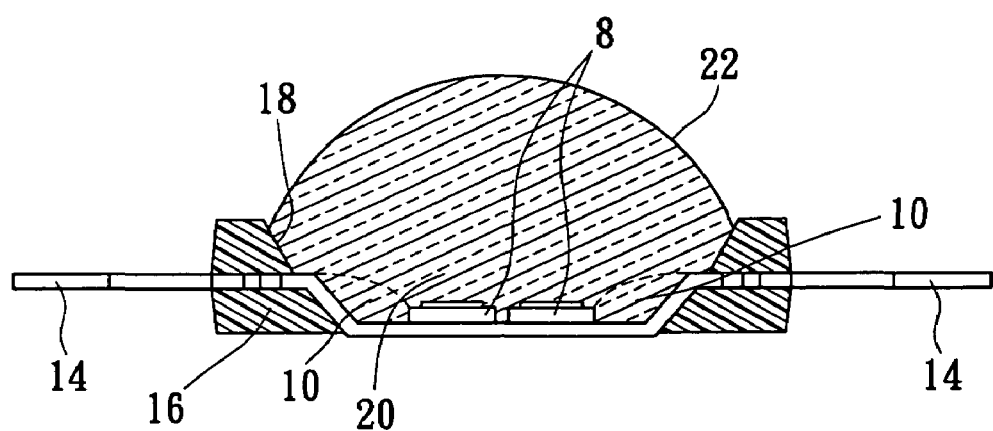
FIG. 3 is a cross-sectional diagram of the optical semiconductor component taken along the hatching 3—3.

Reference is made to FIG. 2 and 3. FIG. 2 is a schematic diagram of an optical semiconductor component in accordance with the present invention and FIG. 3 is a cross-sectional diagram of the optical semiconductor component taken along the hatching 3—3. The optical semiconductor component includes multiple semiconductor chips 6 respectively disposed on chip carriers 8, which are secured on conducting wire holders. The chip carrier 8 has a multi-layer structure. The upper surface of the chip carrier 8 is a conductor for electrically connecting with the semiconductor chip 6. The middle layer of the chip carrier 8 is an insulator (not shown) used to separate the semiconductor chip 6 from the conducting wire holder. The lower surface of the chip carrier 8 can be a conductor or insulator.

The first curved surface 10 is made of a portion of the conducting wire holder and the chip is placed at a focus of the first curved surface 10. The surface of the first curved surface 10 is coated with a material able to enhance the reflective capability. The first curved surface 10 can be a paraboloidal or ellipsoidal surface. The independent connecting components 14 are made of a portion of the conducting wire holders. A portion of the connecting component 14 is located inside the package body for electrically connecting with the semiconductor chip 6 and the other portion is projected from the package body for electrically connecting an external circuit.

The second curved surface 18 is surrounded by the package body 16 and the chip is placed at a focus of the second curved surface 18. The surface of the second curved surface 18 is made of or coated with a material able to enhance the reflective capability. The second curved surface 18 is a smooth paraboloidal or ellipsoidal surface.

The optical semiconductor component includes a window 20 for light to pass through. The window 20 is formed by the first curved surface 10 and second curved surface 18. The semiconductor chips 6 and chip carriers 8 are placed inside the window 20.

The optical semiconductor component also includes a transparent optical component 22 used to cover the window 20. The optical component 22 can be a planar, convex or concave lens.

The chip carriers of the present invention are independent components and have a multi-layer structure. The middle layer of the chip carrier is an insulator used to separate the chip from the conducting wire holder electrically or thermally. Hence, when connected with a metal radiator, the chip carrier won't cause electric leakage.

The connecting components of the present invention are mutually independent, which can provide multiple photodiodes with different driving voltages to connect with each other in series or parallel.

The reflective surface of the present invention is composed of multiple curved surfaces, which are paraboloidal or ellipsoidal surfaces. The chips are placed at the foci of the curved surfaces. Hence, the light can be reflected to the front surfaces of the chips effectively.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. An optical semiconductor component, comprising:
   a plurality of conducting wire holders;
   a plurality of independent chip carriers secured on the conducting wire holders, wherein the independent chip carriers have a multi-layer structure, middle layers of the independent chip carriers being insulators used to separate the semiconductors from the conducting wire holders;
   a plurality of semiconductor chips secured on the independent chip carriers;
   a first curved surface made of a portion of the conducting wire holders, wherein the semiconductor chips are placed at a focus of the first curved surface;
   a plurality of independent connecting components made of another portion of the conducting wire holders; and
   a second curved surface surrounded by a package body, wherein the semiconductor chips are placed at a focus of the second curved surface.

2. The optical semiconductor component as claimed in claim 1, wherein upper surfaces of the independent chip carriers are conductors used to electrically connect with the semiconductor chips.

3. The optical semiconductor component as claimed in claim 1, wherein lower surfaces of the independent chip carriers are conductors or insulators.

4. The optical semiconductor component as claimed in claim 1, wherein the first curved surface is coated with a material able to enhance a reflective capability.

5. The optical semiconductor component as claimed in claim 4, wherein the first curved surface is a paraboloidal or an ellipsoidal surface.

6. The optical semiconductor component as claimed in claim 1, wherein a portion of the independent connecting components is located inside the package body for electrically connecting with the semiconductor chips and another portion of the independent connecting components is projected from the package body for electrically connecting an external circuit.

7. The optical semiconductor component as claimed in claim 1, wherein the second curved surface is made of or coated with a material able to enhance a reflective capability.

8. The optical semiconductor component as claimed in claim 7, wherein the second curved surface is a paraboloidal or an ellipsoidal surface.

9. The optical semiconductor component as claimed in claim 8, wherein the second curved surface is a smooth surface.

10. The optical semiconductor component as claimed in claim 1, further comprising a window for light to pass through, wherein the window is formed by the first curved surface and the second curved surface.

11. The optical semiconductor component as claimed in claim 10, wherein the semiconductor chips and the independent chip carrier are placed inside the window.

12. The optical semiconductor component as claimed in claim 10, wherein the window is covered by a transparent optical component.

13. The optical semiconductor component as claimed in claim 12, wherein the transparent optical component is a planar lens, a convex lens or a concave lens.

14. An optical semiconductor component, comprising:
    a plurality of conducting wire holders;
    a plurality of independent chip carriers secured on the conducting wire holders;
    a plurality of semiconductor chips secured on the independent chip carriers;
    a first curved surface made of a portion of the conducting wire holders, wherein the semiconductor chips are placed at a focus of the first curved surface;
    a plurality of independent connecting components made of another portion of the conducting wire holders; and
    a second curved surface surrounded by a package body, wherein the semiconductor chips are placed at a focus of the second curved surface;
    wherein the first curved surface is coated with a material able to enhance a reflective capability.

15. The optical semiconductor component as claimed in claim 14, wherein the first curved surface is a paraboloidal or an ellipsoidal surface.

16. An optical semiconductor component, comprising:
    a plurality of conducting wire holders;
    a plurality of independent chip carriers secured on the conducting wire holders;
    a plurality of semiconductor chips secured on the independent chip carriers;
    a first curved surface made of a portion of the conducting wire holders, wherein the semiconductor chips are placed at a focus of the first curved surface;
    a plurality of independent connecting components made of another portion of the conducting wire holders; and
    a second curved surface surrounded by a package body, wherein the semiconductor chips are placed at a focus of the second curved surface;
    wherein the second curved surface is made of or coated with a material able to enhance a reflective capability.

17. The optical semiconductor component as claimed in claim 16, wherein the second curved surface is a paraboloidal or an ellipsoidal surface.

18. The optical semiconductor component as claimed in claim 17, wherein the second curved surface is a smooth surface.

* * * * *